United States Patent
Murr et al.

(10) Patent No.: US 6,767,222 B2
(45) Date of Patent: Jul. 27, 2004

(54) PROTECTIVE CONTACT COVER FOR CHIP SOCKET

(75) Inventors: Keith M. Murr, Etters, PA (US); Alexandra Matthews, Palmyra, PA (US); Charles D. Copper, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 37 days.

(21) Appl. No.: 10/043,400

(22) Filed: Jan. 10, 2002

(65) Prior Publication Data

US 2003/0129862 A1 Jul. 10, 2003

(51) Int. Cl.[7] ............................................... H01R 9/09
(52) U.S. Cl. ........................................ 439/71; 439/140
(58) Field of Search ........................... 439/71, 892, 70, 439/66, 83, 331, 571, 330, 567, 572, 526, 73, 140, 141

(56) References Cited

U.S. PATENT DOCUMENTS 4,831,359 A * 5/1989 Newell ........................ 341/5

6,179,624 B1 * 1/2001 McHugh et al. .............. 439/71
6,244,875 B1 * 6/2001 McHugh et al. .............. 439/73

* cited by examiner

Primary Examiner—P. Austin Bradley
Assistant Examiner—Phuongchi Nguyen

(57) ABSTRACT

A socket is shown for interconnecting a chip to a printed circuit board, where the socket is comprised of a housing and a substrate. The substrate is of the type comprising a plurality of wire leads extending upwardly from the substrate, and which are interconnected to solder balls on the opposite side of the substrate. The housing has a plurality of slots therethrough, such that the substrate can be positioned on the lower side of the housing with the resilient leads extending upwardly in the slots. A chip receiving face is positioned on the opposite side of the housing for contacting the resilient leads of the substrate. The housing includes resilient arms on opposite sides of the housing, which grip the substrate and which maintain the housing in a resiliently biased position above the substrate, such that the leads remain in their respective slots.

20 Claims, 8 Drawing Sheets

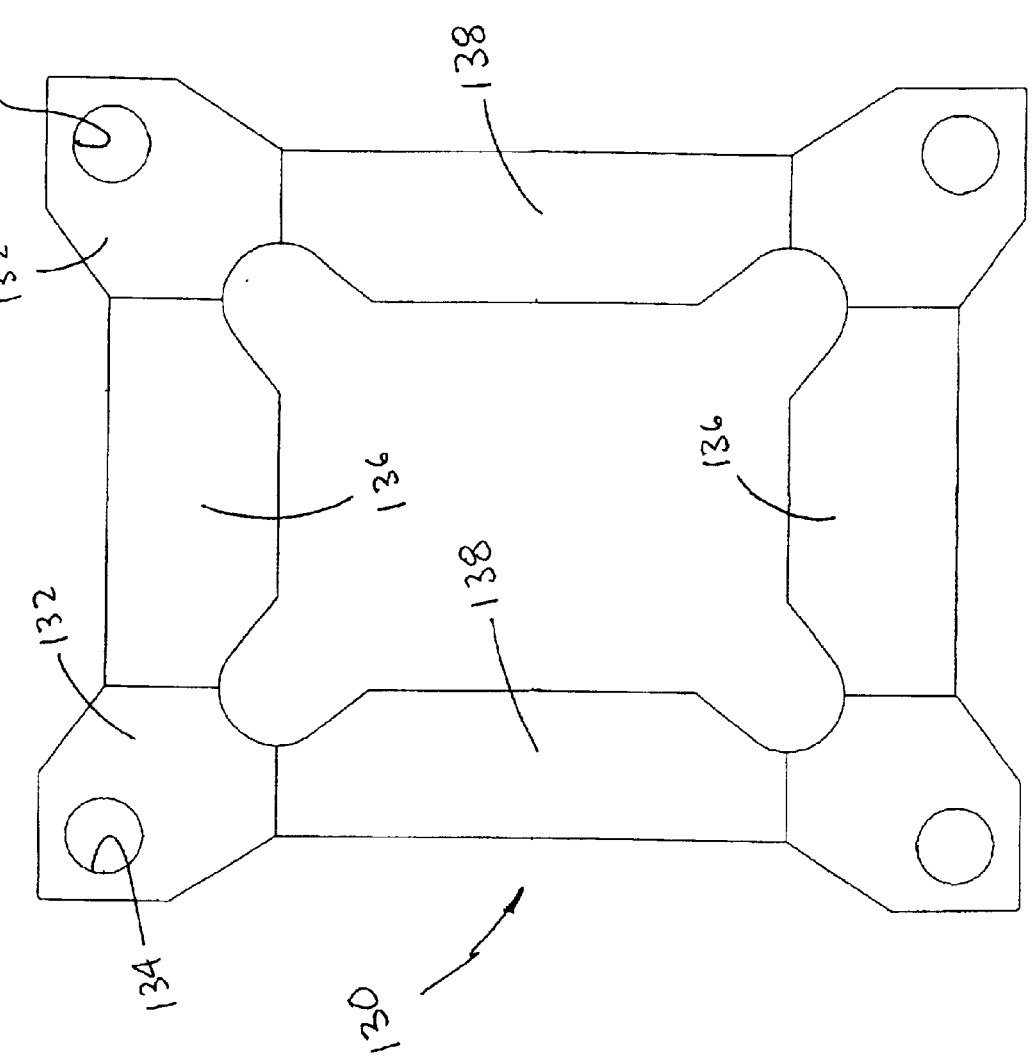

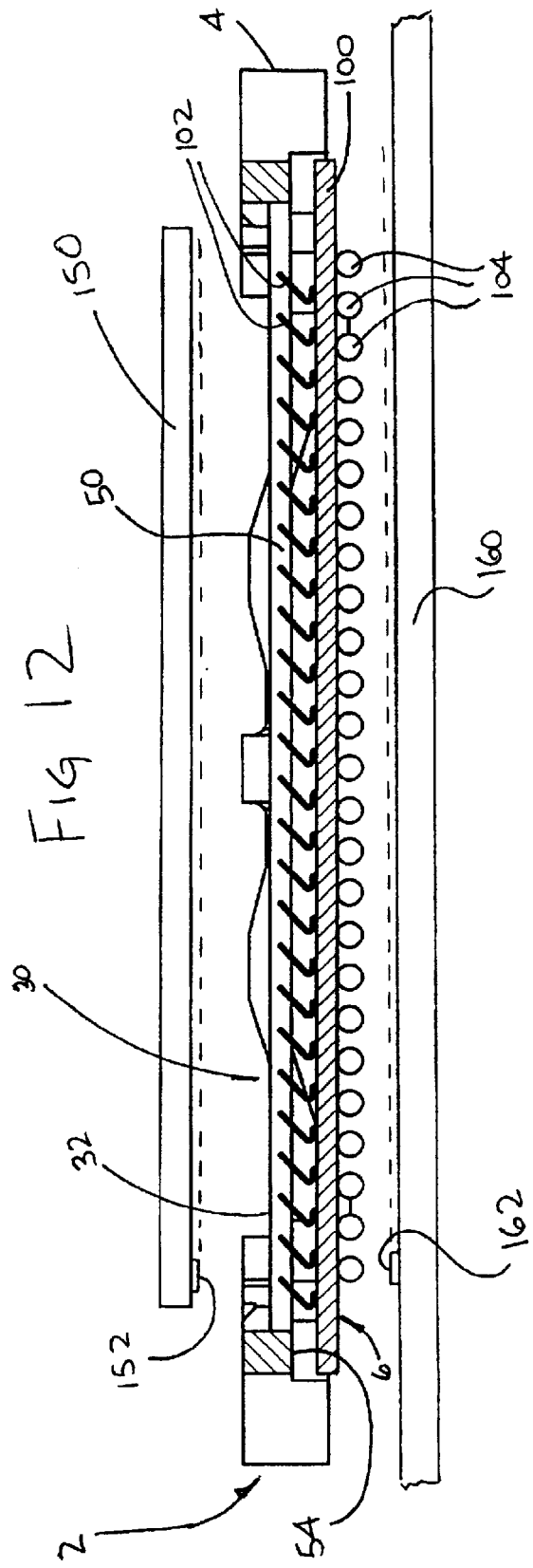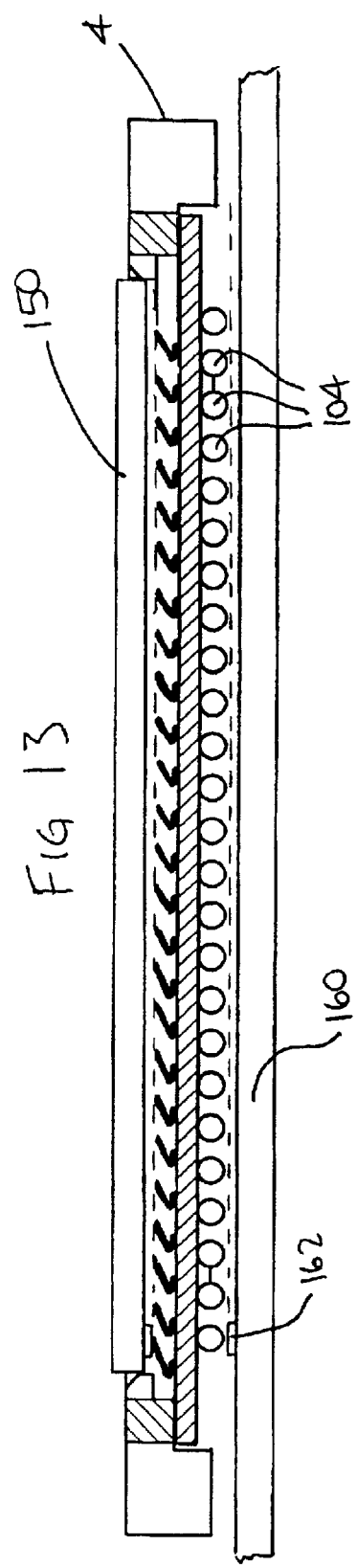

PROTECTIVE CONTACT COVER FOR CHIP SOCKET

BACKGROUND OF THE INVENTION

The subject invention relates to a socket for interconnecting a chip with a printed circuit board.

SUMMARY OF THE PRIOR ART

Due to the small center-line spacing between electrical pads of a chip, it is known in the art to provide a substrate having resilient leads extending from one side of the substrate, and solder balls on the opposite side of the substrate, where the leads and the solder balls are electrically interconnected through vias in the substrate. Such a substrate can include a housing therearound, whereby the housing will provide a location for a chip to be interconnected to the substrate leads.

However, existing connection systems provide that the leads extend entirely through the associated housing, and thus present the possibility for damage to the leads. This damage can occur in multiple ways, but it is common that the leads are damaged when the chip is placed adjacent to the housing, in that the leads must be resiliently biased downwardly in order to align the chip with an associated housing. Secondly, as the leads extend proud of the housing, it is common that tooling or other mechanisms will grab the exposed leads and bend or break them from the substrate.

Thus, a need exists in the marketplace to provide a solution to the above-mentioned shortcomings.

SUMMARY OF THE INVENTION

The objects of the invention have been accomplished by providing a socket for interconnecting a chip to a substrate, where the chip includes pads thereon and the substrate includes leads extending upwardly therefrom and are profiled to contact the pads. The socket comprises a housing having an upper chip receiving face, a lower substrate receiving face, and a plurality of longitudinally extending slots extending between the upper chip receiving face and the lower substrate receiving face. The socket includes at least one resilient arm extending downwardly therefrom for contacting the substrate.

In the preferred embodiment of the invention, the housing includes marginal side walls and marginal end walls, with the longitudinally extending slots being formed by ribs extending between the end walls. The resilient arm extends from one of the marginal side walls, and preferably comprises a pair of resilient arms along the one side marginal wall. The housing further comprises a post attached to each of the marginal side walls, and resilient arms extending therefrom. The resilient arms extend parallel to the marginal side walls. Each resilient arm includes a foot portion adjacent to a free end of each arm, the foot portion having a lower surface, which is resiliently movable from a first free state position below the lower substrate receiving face to a resiliently deformable position planar with the lower substrate receiving face. Each foot portion includes a substrate retaining member.

In another aspect of the invention, a socket is provided for interconnecting a chip to a printed circuit board, where the chip includes pads thereon. The socket comprises a housing having an upper chip receiving face, a lower substrate receiving face, and a plurality of lead receiving openings extending between the upper chip receiving face and the lower substrate receiving face. A substrate is provided having a plurality of leads extending upwardly therefrom and positioned within the lead receiving openings, with contact ends of the leads positioned below the chip receiving face. A resilient spacer is positioned between the substrate and the housing, the spacer being deformable to a position where the leads extend through the chip receiving face.

In the preferred embodiment of the invention, the spacer is comprised of at least one resilient arm extending downwardly therefrom for contacting the substrate. The housing includes marginal side walls and marginal end walls, and the lead receiving openings are defined as longitudinally extending slots extending between the end walls. The resilient spacer is defined as a resilient arm extending from one of the marginal side walls. The socket preferably further comprises a pair of resilient arms along the one marginal side wall. The socket comprises a post attached to each of the marginal side walls, and resilient arms extending therefrom. The resilient arms extend parallel to the marginal side walls. The resilient arm includes a foot portion adjacent to a free end of each arm, and the foot portion has a lower surface, which is resiliently movable from a first free state position below the lower substrate receiving face to a resiliently deformable position planar with the lower substrate receiving face, and each foot portion includes a substrate retaining member. The substrate has a lead contact field and openings along side marginal edges thereof, and the substrate retaining members comprise posts interferingly positioned within the openings.

Preferably, the housing includes marginal side walls and marginal end walls, and the upper chip receiving face is defined by a recess into the housing defining inner peripheral edges in the marginal side walls and marginal end walls. The socket further comprises locating members positioned adjacent the recess for positioning the chip in the housing in juxtaposition with the leads.

BRIEF DESCRIPTION OF THE DRAWINGS

FIG. 10 is a top plan view of the spring cover usable with the socket assembly of FIG. 1;

FIG. 11 is a side plan view of the spring cover of FIG. 10;

FIG. 12 is a side plan view, partially in section showing the socket assembly juxtaposed intermediate a printed circuit board and chip; and FIG. 13 shows the chip shown in FIG. 12 in the fully assembled position.

DETAILED DESCRIPTION OF THE PREFERRED EMBODIMENT

Figure 1:
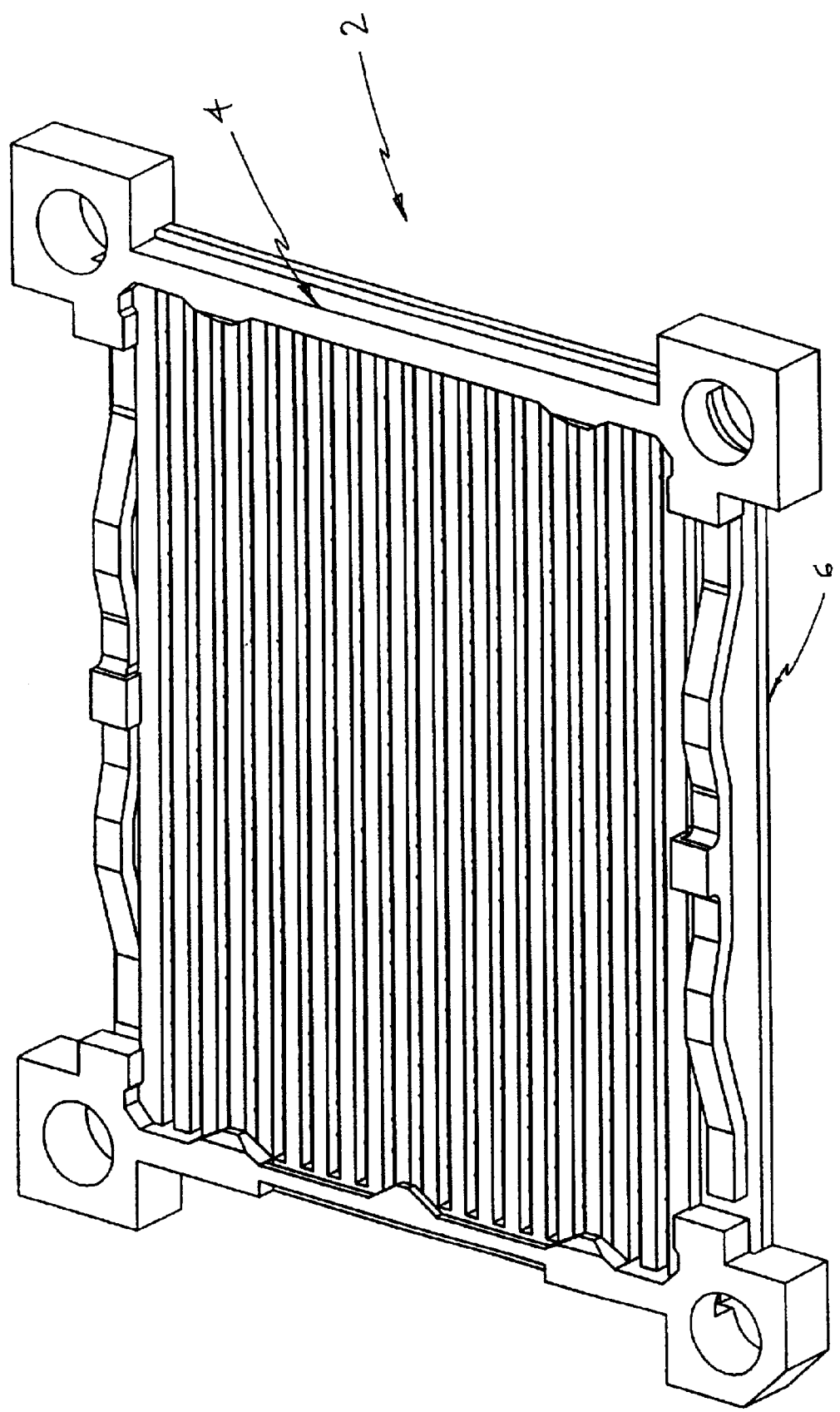
FIG. 1 is a perspective view of the socket of the subject invention.
Figure 2:
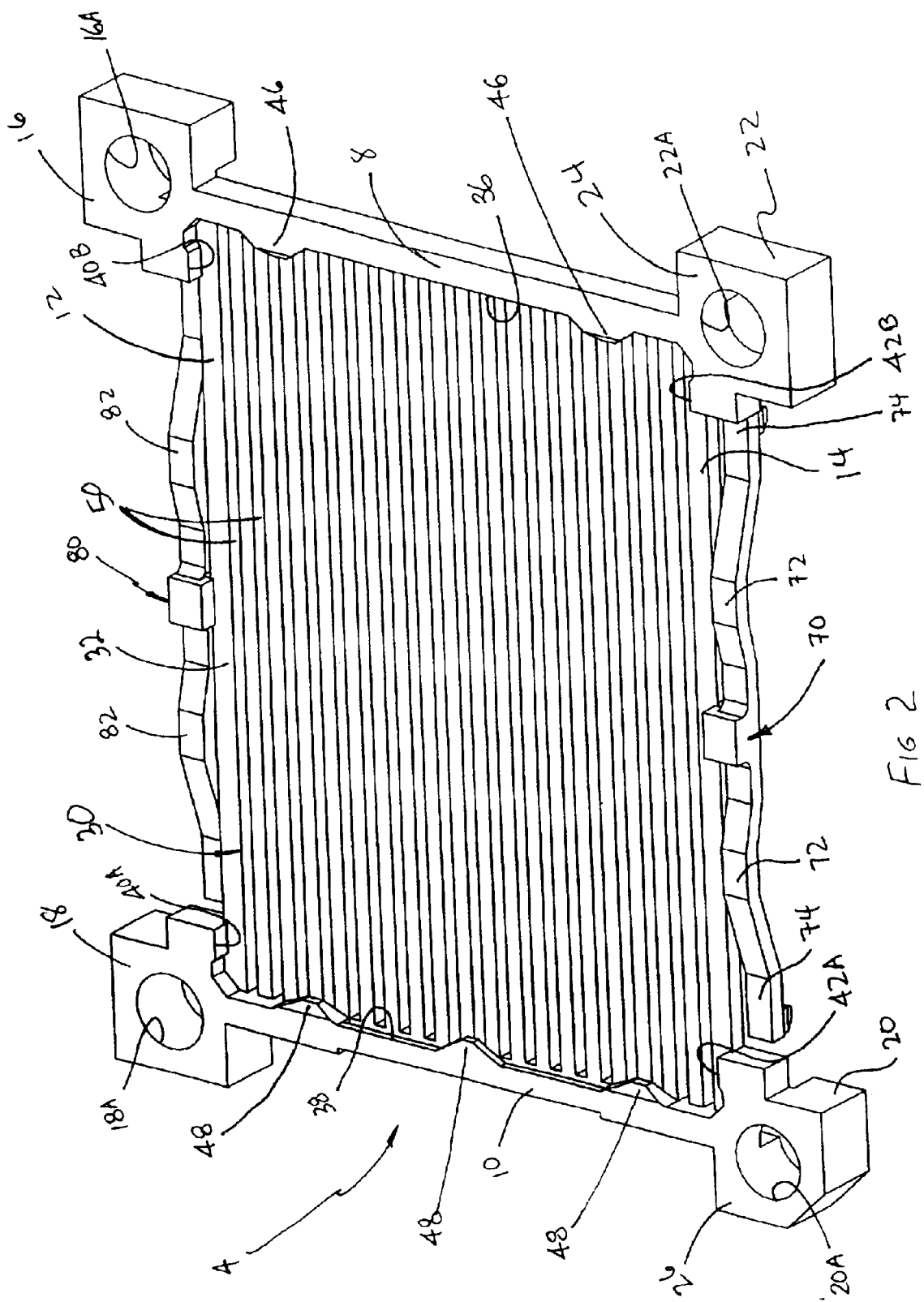
FIG. 2 is a perspective view of the housing portion of the socket assembly shown in FIG. 1.
Figure 3:
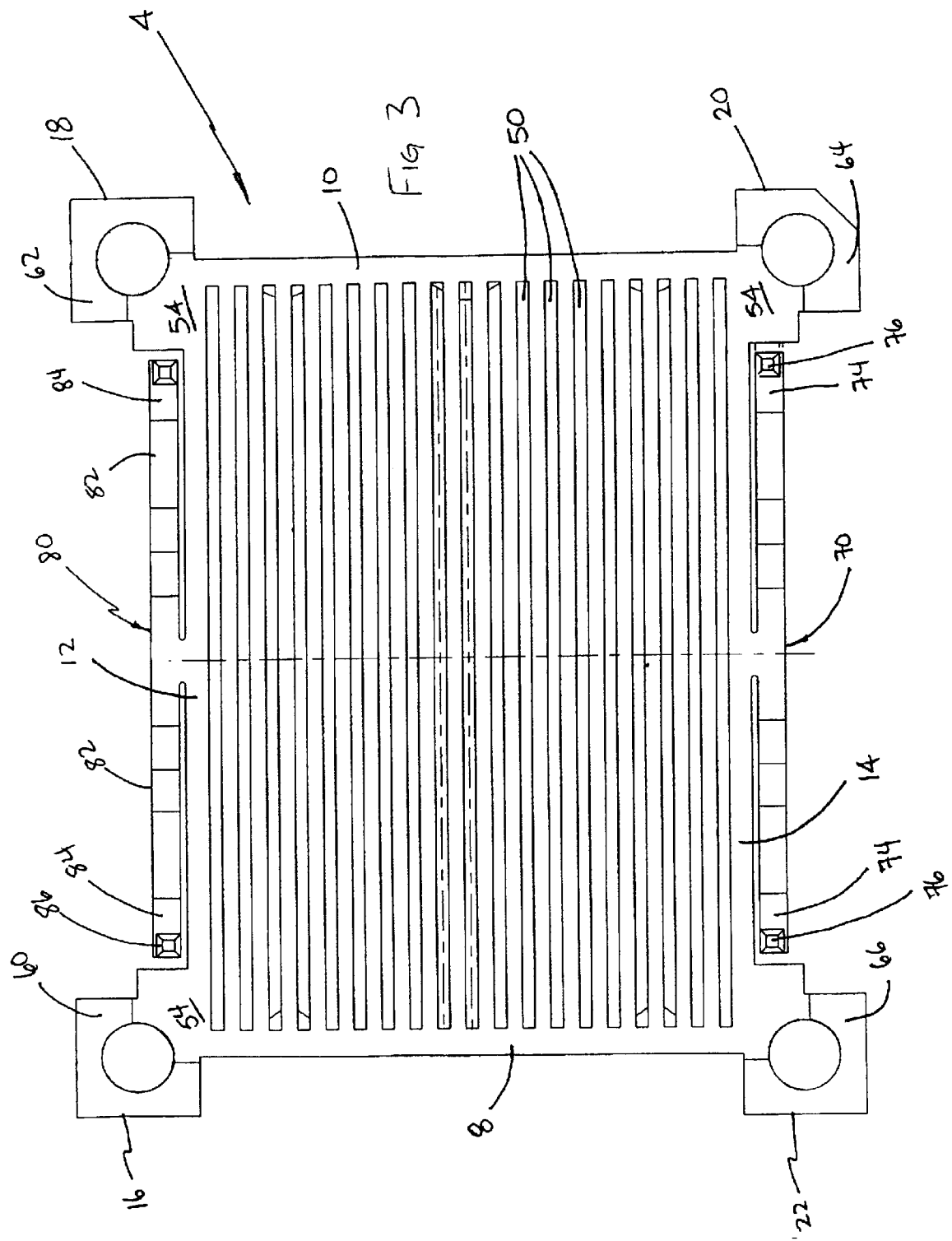
FIG. 3 is a lower plan view of the socket housing of FIG. 2.

With reference first to FIG. 1, a socket assembly is shown generally at 2 comprising a housing portion 4, together with a substrate portion 6. It should be understood that the substrate portion 6 is profiled for receipt on, and interconnection with, a printed circuit board, such as a motherboard, and the housing 4 is profiled to receive a chip package having an array of pads which require interconnection to the printed circuit board. With reference now to FIGS. 2–3, the housing 4 will be described in greater detail.

Housing 4 includes marginal end walls 8, 10 and marginal side walls 12, 14. An integrally molded corner member 16 is mounted at the intersection of marginal end wall 8, and marginal side wall 12, and likewise, corner mounting members 18, 20 and 22 are integrally molded at the other corners. Each corner mounting member 16–22 includes an associated mounting aperture. The top of housing 4 includes a planar surface at 24, which extends across corner mounting members 16 and 22 and along the top of marginal end wall 8. Top surface 26 is co-planar with surface 24, and extends between corner mounting members 18 and 20, and across marginal end wall 10. A chip receiving recess, generally shown at 30, is provided as a recess through top surfaces 24, 26 forming a top chip receiving face at 32. The recess also includes inner peripheral edges 36, 38 (adjacent to marginal end walls 8, 10, respectively) and peripheral side edges 40A, 40B and 42A, 42B (adjacent to marginal side edges 12, 14, respectively). The peripheral end edges 36, 38 include locating members 46, whereas peripheral end edge 38 includes locating members 48.

Upper surface 32 is interrupted by a plurality of side-by-side slots 50, which extend laterally between marginal side walls 12 and 14 and extend from marginal end walls 8, 10. As shown in FIG. 3, housing 4 includes a lower surface at 54, which defines a substrate-receiving face as will be described further herein. It should be appreciated from viewing FIG. 3, that slots 50 extend through top surface 32 and through bottom surface 54, to form a communication between the two surfaces, 32, 54. Finally, as viewed in FIG. 3, the corner mounting members 16–20 include raised mounting sections 60–66, respectively, which extend away from surface 54.

Finally, with respect to both FIGS. 2 and 3, a housing extension portion is shown generally at 70, which is integrally formed with marginal side wall 14 and includes resilient spacer spring arms 72, which extend into feet portion 74 having board retaining lugs at 76. In a likewise manner, marginal side wall 12 has integrally molded thereto, a housing extension portion 80 having resilient spacer spring arms 82 with feet portions 84 and board mounting lugs 86.

Figure 4:
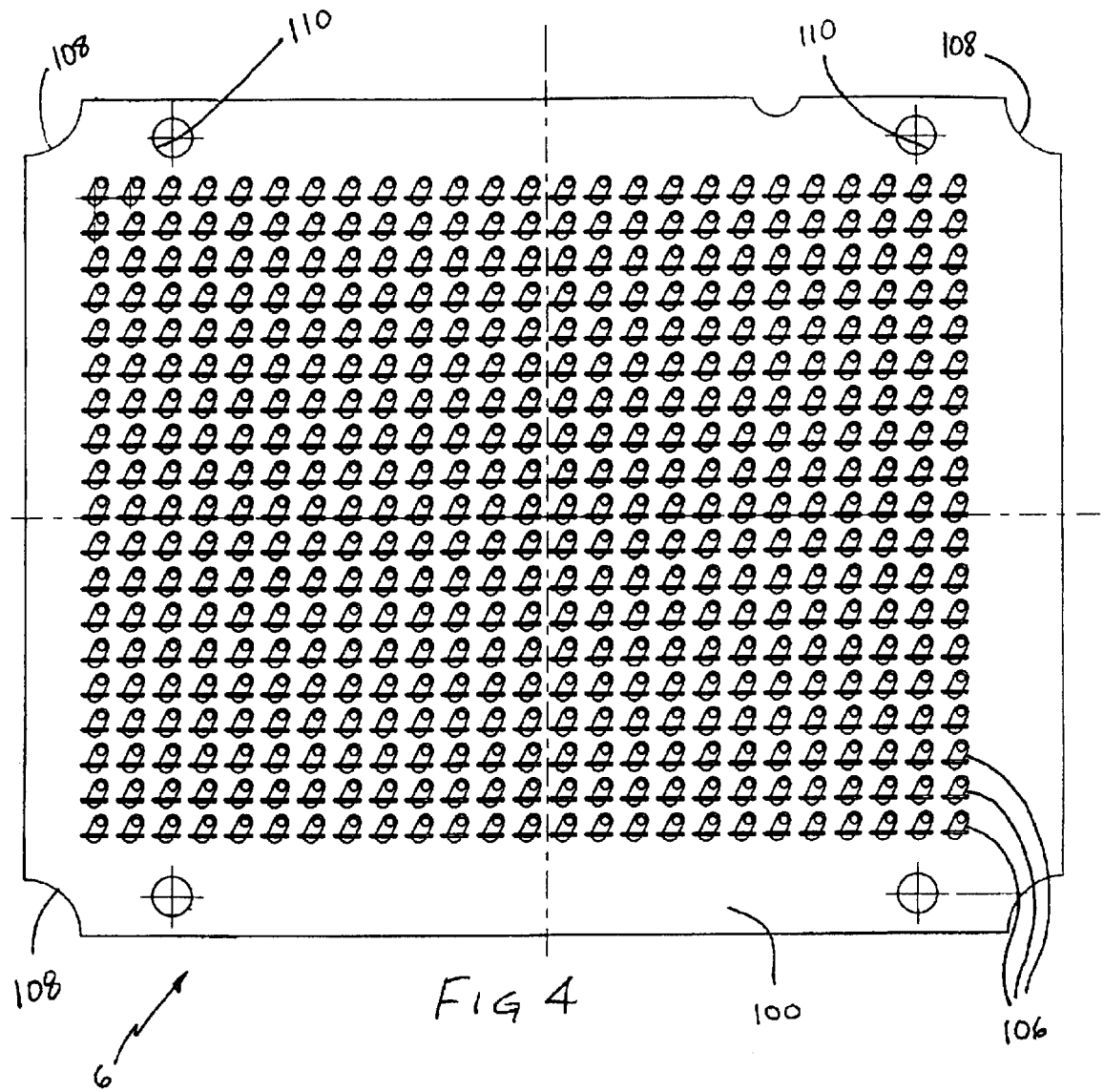
FIG. 4 is a top plan view of the substrate shown in FIG. 1.
Figure 5:
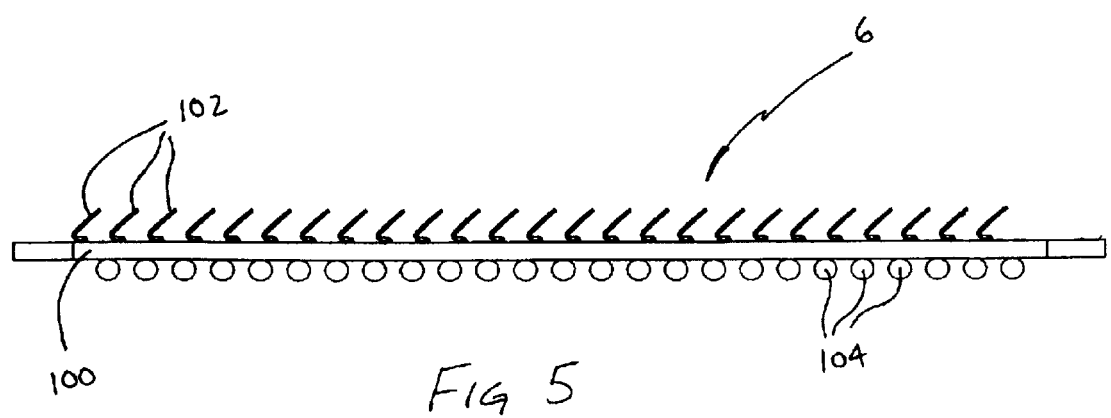
FIG. 5 is a side plan view of the substrate shown in FIG. 4.
Figure 6:
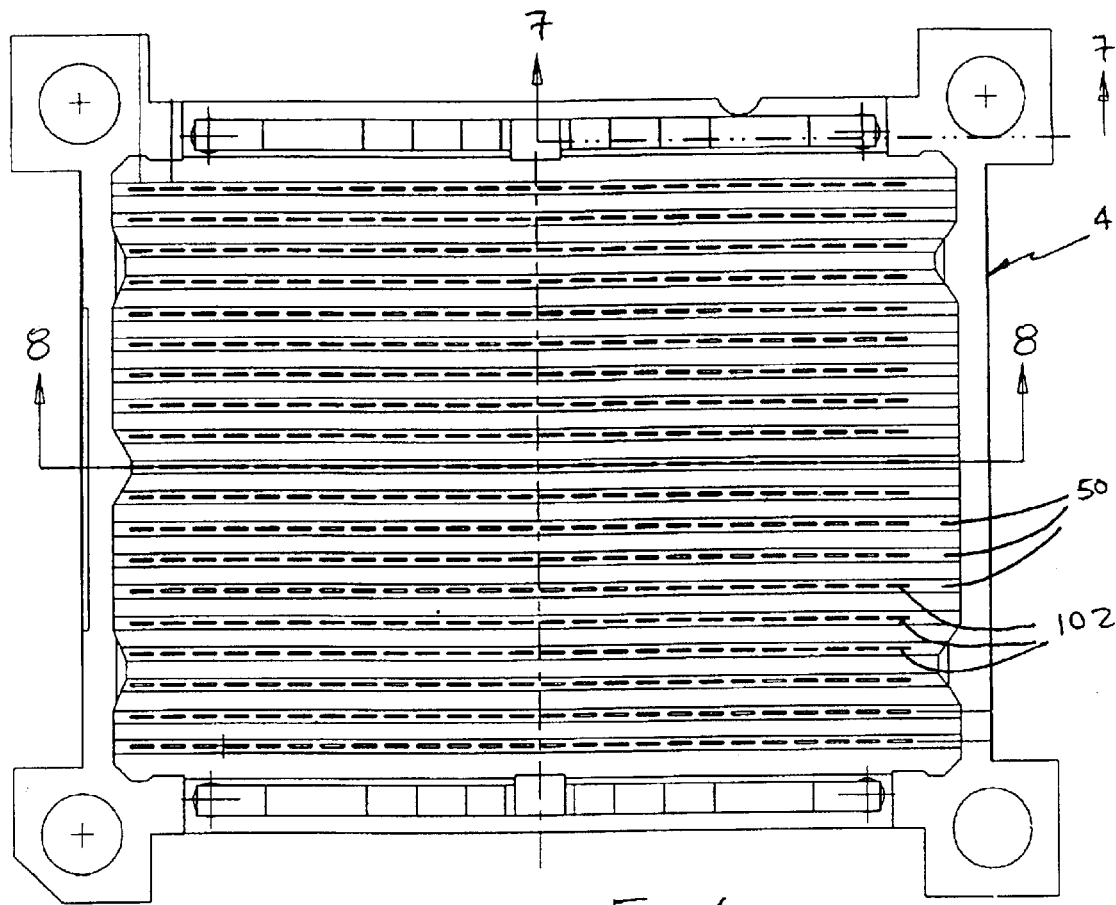
FIG. 6 is a top plan view of the assembled socket assembly shown in FIG. 1.
Figure 7:
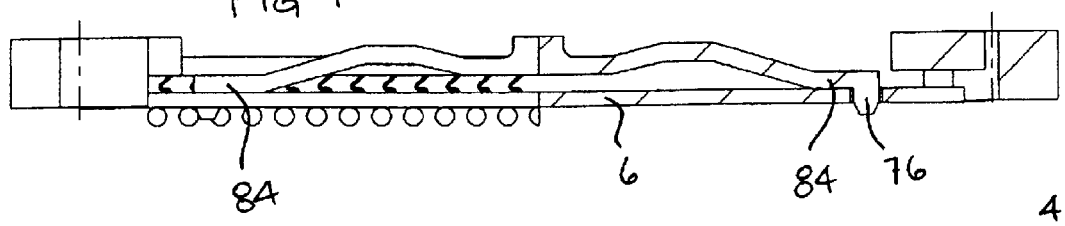
FIG. 7 is a cross-sectional view taken through lines 7—7 of FIG. 6.

With respect now to FIGS. 4 and 5, substrate assembly 6 is shown in greater detail comprising a substrate 100, having on one side a plurality of resilient leads 102, which as shown in FIG. 4 extend in a plurality of columns and rows, and which are electrically connected to a plurality of solder balls such as 104 on the opposite side of substrate 100. Leads 102 are electrically connected to solder balls 104 through vias 106 as is well known in the art. Substrate 100 further includes radiused corner sections 108 and mounting apertures at 110.

With reference to FIGS. 6–9, the assembly of the substrate 6 to the housing 4 will be described in greater detail. As shown first in FIG. 6, the plurality of leads 102 are lined in respective slots 50, and posts 76 are positioned in respective openings 110. It should be appreciated that posts 76 are profiled for an interference fit with apertures 110, such that substrate 6 is held to housing 4. As shown best in FIG. 7, feet members 84 can be positioned in an abutting planar relation with substrate 6 to retain substrate 6 to housing member 4.

Figure 8:
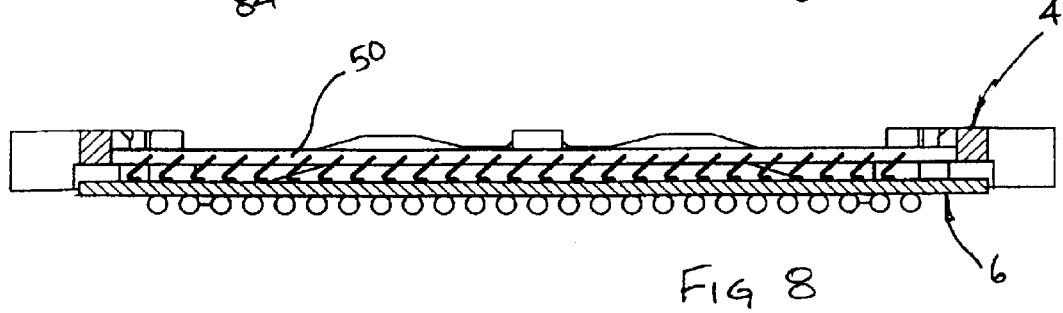
FIG. 8 is a cross-sectional view taken through lines 8—8 of FIG. 6.
Figure 9:
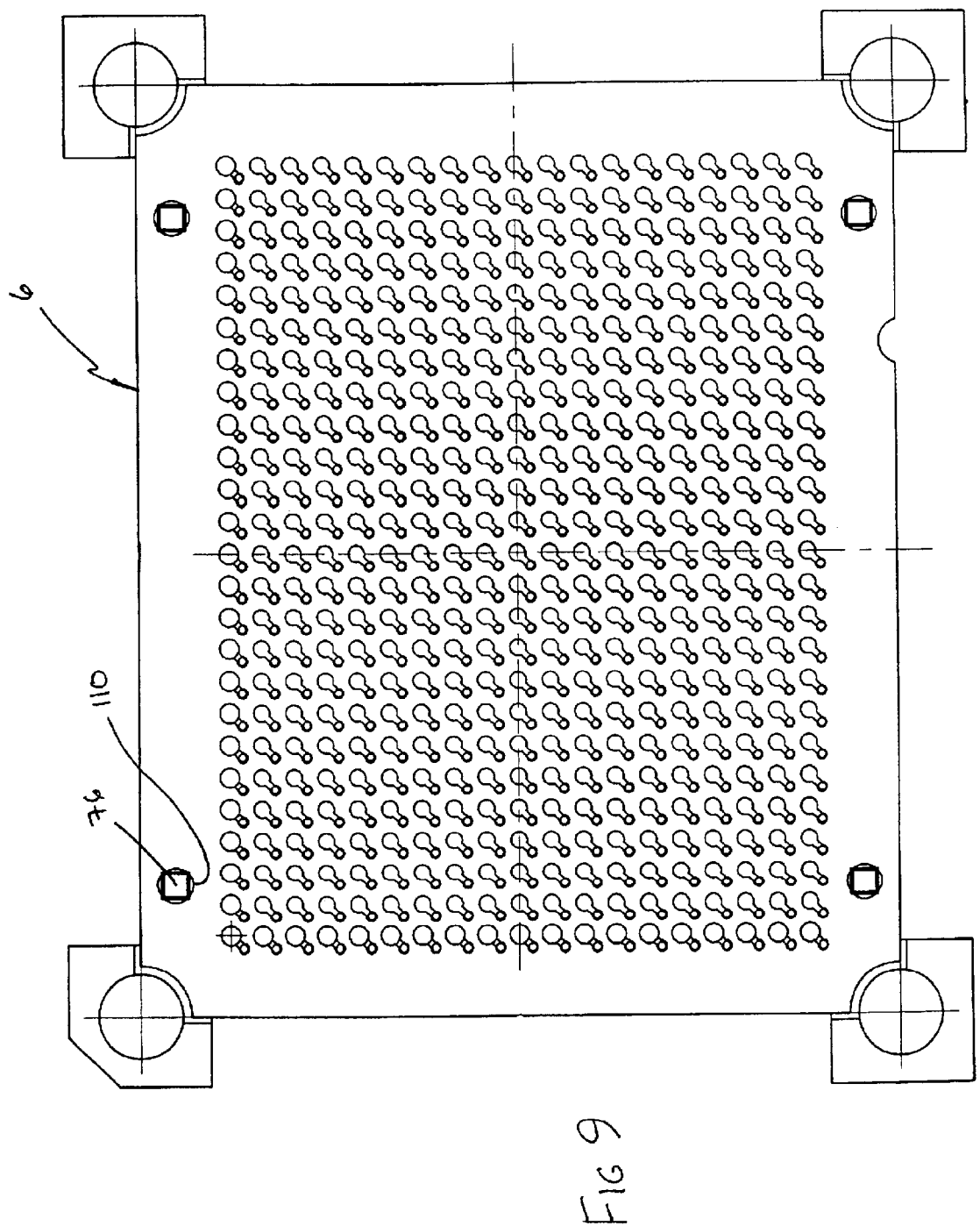
FIG. 9 is a lower plan view of the assembled socket shown in FIG. 6.

As shown in FIG. 8, housing 4 is shown in a spaced relation relative to substrate 6, and in particular shows the plurality of leads 102 being recessed within its respective slot 50.

With respect now to FIG. 10, a spring cover is shown at 130, including corner members 132 having apertures 134, which are profiled to overlap the apertures in the corner members 16–22. The spring cover 130 also includes spring urging members 136 and 138.

With respect now to FIGS. 12 and 13, the application of the socket 2 will be described in greater detail. As shown first in FIG. 12, a socket 2 is shown having a chip 150 positioned above recess 30, and socket 2 is shown positioned above printed circuit board 160. As shown in FIG. 12, chip 150 would include a plurality of contact pads 152, whereas circuit board 160 would include a plurality of lands or pads 162. The socket 2 may be positioned on the printed circuit board 160 such that the plurality of balls 104 is aligned with the plurality of pads 162, whereupon chip 150 may be placed in the nest, on top of surface 32. It should be appreciated that at this point, leads 102 still reside within the respective slots 50, below surface 32. At this position, spring cover 130 may be placed over the assembly shown in FIG. 12 and fasteners, such as screws or bolts, can be placed through the respective apertures 16A–22A and through apertures in printed circuit board 160 (not shown) to draw the housing portion 4, and the chip 150 downwardly, to the position shown in FIG. 13. The movement of the housing portion 4 downwardly, between the positions in FIGS. 8 and 13, is accomplished by way of resilient spacer arms 72, 82 being resiliently deformable in a direction generally perpendicular to the receiving face. When in this position, leads 102 resiliently bias and contact the plurality of pads 152, whereas balls 104 are in contact with the plurality of lands 162.

Advantageously, socket 2 can be manipulated when in the assembled position comprising the housing 4 and the substrate 6 without fear of damaging the fragile lead sections 102. The chip 150 can also be placed and aligned within the recessed portion 30, again without fear of damage to lead sections 102. It is not until the chip 150 is fully aligned with the respective leads 102 that the housing 4 is drawn downwardly whereupon lead sections 102 extend through respective slots 50 to contact corresponding pads 152.

What is claimed is:

1. A socket for interconnecting a chip to a substrate, where the chip includes pads thereon and the substrate includes leads extending upwardly therefrom and are profiled to contact the pads, the socket comprising a housing having an upper chip receiving face, a lower substrate receiving face, and a plurality of longitudinally extending slots extending between said upper chip receiving face and said lower substrate receiving face, said socket including at least one resilient arm extending downwardly therefrom for contacting the substrate, the resilient arm being resilient in a direction generally perpendicular to said lower substrate receiving face, to allow resilient movement of the substrate towards and away from the lower substrate receiving face.

2. The socket of claim 1, wherein said housing includes marginal side walls and marginal end walls, with said longitudinally extending slots being formed by ribs extending between said end walls.

3. The socket of claim 2, wherein said at least one resilient arm extends from one of said marginal side walls.

4. The socket of claim 3, further comprising a pair of resilient arms along said one side marginal wall.

5. The socket of claim 4, further comprising a post attached to each of said marginal side walls, and resilient arms extending therefrom.

6. The socket of claim 5, wherein said resilient arms extend parallel to said marginal side walls.

7. The socket of claim 5, wherein each said resilient arm includes a foot portion adjacent to a free end of each said arm, said foot portion having a lower surface, which is resiliently movable from a first free state position below said lower substrate receiving face to a resiliently deformable position planar with said lower substrate receiving face.

8. The socket of claim 7, wherein each said foot portion includes a substrate retaining member.

9. A socket for interconnecting a chip to a printed circuit board, where the chip includes pads thereon, said socket comprising:

a housing having an upper chip receiving face, a lower substrate receiving face, and a plurality of lead receiving openings extending between said upper chip receiving face and said lower substrate receiving face;

a substrate having a plurality of leads extending upwardly therefrom and positioned within said lead receiving openings, with contact ends of said leads positioned below said chip receiving face; and a resilient spacer positioned between said substrate and said housing, said spacer being deformable to a position where said housing may be moved relative to said leads, such that said leads extend through said chip receiving face.

10. The socket of claim 9, wherein said housing includes marginal side walls and marginal end walls, and said upper chip receiving face is defined by a recess into said housing defining inner peripheral edges in said marginal side walls and marginal end walls.

11. The socket of claim 10, further comprising locating members positioned adjacent said recess for positioning said chip in said housing in juxtaposition with said leads.

12. The socket of claim 9, wherein said spacer is comprised of at least one resilient arm extending downwardly therefrom for contacting the substrate.

13. The socket of claim 12, wherein said housing includes marginal side walls and marginal end walls, and said lead receiving openings are defined as longitudinally extending slots extending between said end walls.

14. The socket of claim 13, wherein said resilient spacer is defined as a resilient arm extending from one of said marginal side walls.

15. The socket of claim 14, further comprising a pair of resilient arms along said one side marginal wall.

16. The socket of claim 15, further comprising a post attached to each of said marginal side walls, and resilient arms extending therefrom.

17. The socket of claim 16, wherein said resilient arms extend parallel to said marginal side walls.

18. The socket of claim 16, wherein each said resilient arm includes a foot portion adjacent to a free end of each said arm, said foot portion having a lower surface, which is resiliently movable from a first free state position below said lower substrate receiving face to a resiliently deformable position planar with said lower substrate receiving face.

19. The socket of claim 18, wherein each said foot portion includes a substrate retaining member.

20. The socket of claim 19, wherein said substrate has a lead contact field and openings along side marginal edges thereof, and said substrate retaining members comprises posts interferingly positioned within said openings.

* * * * *